United States Patent
Scheuerlein

(10) Patent No.: US 7,243,203 B2
(45) Date of Patent: Jul. 10, 2007

(54) PIPELINE CIRCUIT FOR LOW LATENCY MEMORY

(75) Inventor: Roy E. Scheuerlein, Cupertino, CA (US)

(73) Assignee: SanDisk 3D LLC, Sunnyvale, CA (US)

( * ) Notice: Subject to any disclaimer, the term of this patent is extended or adjusted under 35 U.S.C. 154(b) by 301 days.

(21) Appl. No.: 10/461,295

(22) Filed: Jun. 13, 2003

(65) Prior Publication Data

US 2004/0255088 A1 Dec. 16, 2004

(51) Int. Cl.
*G06F 12/00* (2006.01)
(52) U.S. Cl. .................. 711/169; 711/138; 711/140
(58) Field of Classification Search ........... 711/138, 711/140, 169
See application file for complete search history.

(56) References Cited

U.S. PATENT DOCUMENTS

| | | | |
|---|---|---|---|
| 6,034,882 A | 3/2000 | Johnson et al. | |
| 6,420,215 B1 | 7/2002 | Knall et al. | |
| 6,525,953 B1 | 2/2003 | Johnson | |
| 6,563,745 B1 | 5/2003 | Ilkbahar | |
| 6,567,287 B2 | 5/2003 | Scheuerlein | |
| 6,574,145 B2 | 6/2003 | Kleveland et al. | |
| 2002/0028541 A1 | 3/2002 | Lee et al. | |
| 2003/0043643 A1 | 3/2003 | Scheuerlein et al. | |
| 2003/0070044 A1* | 4/2003 | Jeddeloh | 711/118 |
| 2003/0081489 A1 | 5/2003 | Scheuerlein et al. | |
| 2003/0097535 A1* | 5/2003 | Hsu et al. | 711/169 |
| 2003/0115514 A1 | 6/2003 | Ilkbahar et al. | |
| 2003/0185048 A1* | 10/2003 | Fricke et al. | 365/170 |
| 2004/0077204 A1* | 4/2004 | Zeng | 439/342 |
| 2005/0076152 A1* | 4/2005 | Huppenthal et al. | 709/250 |

OTHER PUBLICATIONS

"A Compact On-Chip ECC for Low Cost Flash Memories", IEEE Journal of Solid State Circuits, vol. 32, No. 5, May 1997.
"FAM 17.8: A 1Mb CMOS DRAM with Fast Page and Static Column Modes", ISSCC 85 Friday 15, 1985/East Ballroom/12:15 p.m. Session XVII: Megabit DRAMs.
"FAM 19.8: A 1Mb DRAM with 33 MHz Serial I/O Ports", ISSCC 86/ Friday, Feb. 21, 1986/Pacific Ballroom/ 12:15 p.m. Session XIX: Dynamic RAMs.

(Continued)

*Primary Examiner*—Woo H. Choi
(74) *Attorney, Agent, or Firm*—Brinks Hofer Gilson & Lione

(57) ABSTRACT

The embodiments herein describe a memory device and method for reading and writing data. In one embodiment, a memory device is provided comprising a memory array and first and second data buffers in communication with the memory array. The second data buffer comprises a larger storage capacity than the first data buffer. During a write operation, data is stored in the second data buffer and then stored in the memory array. During a read operation, data is read from the memory array and then stored in the first data buffer but not in the second data buffer. Because the smaller-storage-capacity buffer takes less time to fill than the larger-storage-capacity buffer, there is less of a delay in outputting data from the memory device as compared to memory devices that use a larger-storage-capacity buffer for both read and write operations. Other embodiments are provided, and each of the embodiments can be used alone or in combination with one another.

33 Claims, 3 Drawing Sheets

OTHER PUBLICATIONS

"Flash Memory Data Book", Silicon Storage Technology, Inc. 1996.

"Partial Selection of Passive Element Memory Cell Sub-Arrays for Write Operation", Roy E. Scheuerlein and Matthew P. Crowley, U.S. Appl. No. 09/748,649, filed Dec. 22, 2000.

"Three-Dimensional Memory", Monty Cleeves, U.S. Appl. No. 10/185,508, filed Jun. 27, 2002.

"High Density 3D Rail Stack Arrays and Method of Making", Kedar Patel, Alper Ilkbahar, Roy Scheuerlein and Andrew J. Walker, U.S. Appl. No. 10/180,046, filed Jun. 27, 2002.

"An Improved Method for Making High-Density Nonvolatile Memory", S. Brad Herner, Maitreyee Mahajani and Michael A. Vyvoda, U.S. Appl. No. 10/326,470, filed Dec. 19, 2002.

"Semiconductor Device with Localized Charge Storage Dielectric and Method of Making Same", Alper Ilkabahar, Roy Scheuerlein, Andrew Walker and Luca Fasoli, U.S. Appl. No. 10/325,951, filed Dec. 23, 2002.

"Programmable Memory Array Structure Incorporating Series-Connected Transistor Strings and Methods for Fabrication and Operation of Same", Roy E. Schererlein, Christopher Petti, Andrew J. Walker, En-Hsing Chen, Sucheta Nallamothu, Alper Ilkbahar, Luca Fasoli, Igor Kouznetsov, U.S. Appl. No. 10/335,078, filed Dec. 31, 2002.

"Method for Fabricating Programmable Memory Array Structures Incorporating Series-Connected Transistor Strings", Andrew J. Walker, En-Hsing Chen, Sucheta Nallamothu, Roy E. Scheuerlein, Alper Ilkbahar, Luca Fasoli, Igor Kouznetsov, Christopher Petti, U.S. Appl. No. 10/335,089, filed Dec. 31, 2002.

\* cited by examiner

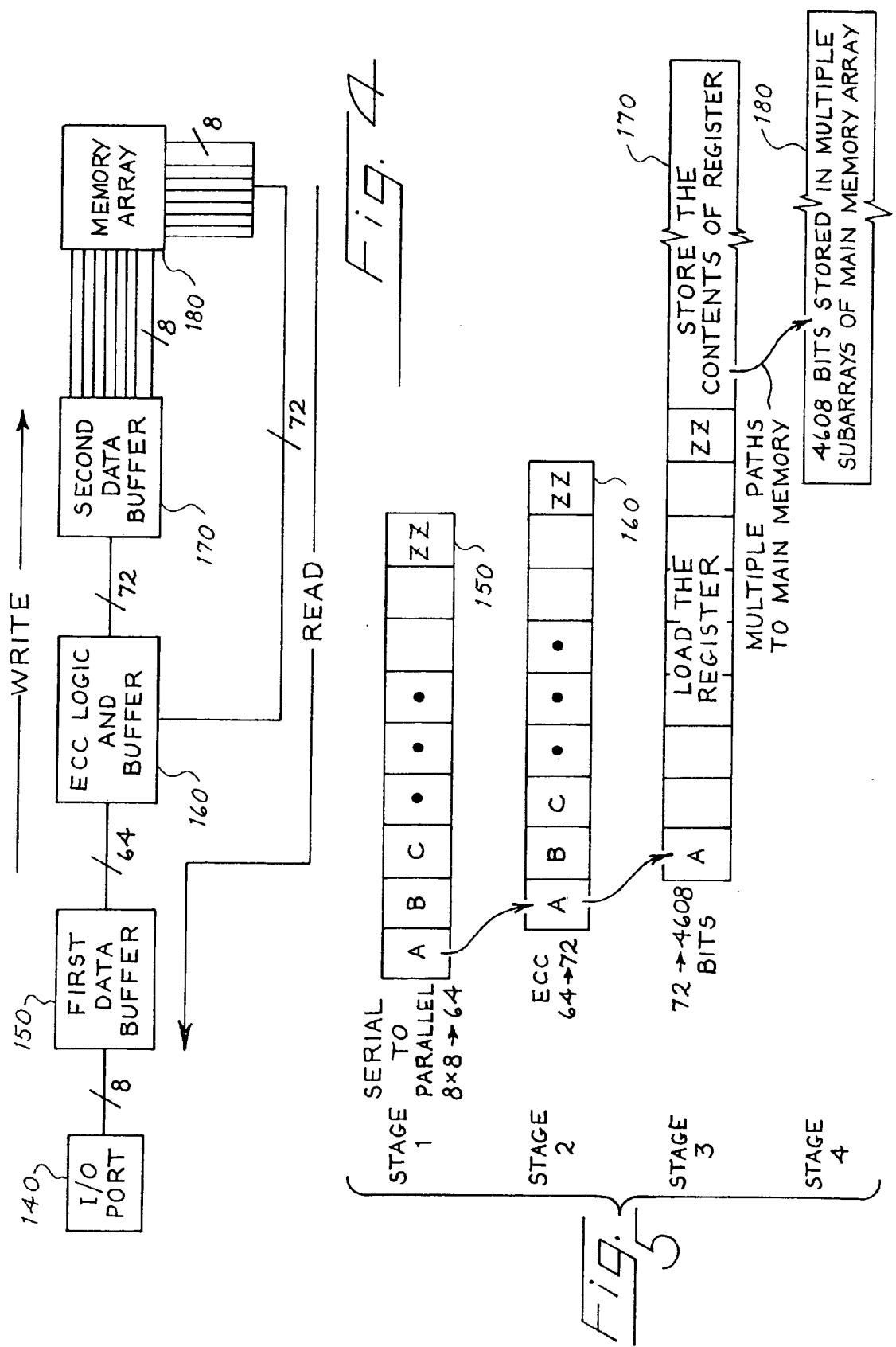

US 7,243,203 B2

PIPELINE CIRCUIT FOR LOW LATENCY MEMORY

BACKGROUND

In page-oriented memories, a page register is used as a temporary storage structure to hold data being written to and read from a memory array. During a write operation, the page register is populated with data, and when the page register holds a page of data, the data is written from the page register to the memory array. During a read operation, data read from the memory array is stored in the page register, and when the page register holds a page of data, the data is outputted. One of the benefits of using a page register is that it reduces the delay perceived by an end user when storing data in the memory array, since storing data in the page register takes less time than storing data in the memory array. However, some of the delays associated with a write operation are not present in a read operation. Further, during a read operation, an entire page of data is read from the memory array and written into the page register before even a single bit of data from that page is outputted. This delay can be noticeable to an end user, especially if the user spends more time reading from the memory array than writing to the memory array, which is likely to happen if the memory array is a write-once memory array.

SUMMARY

The present invention is defined by the following claims, and nothing in this section should be taken as a limitation on those claims.

By way of introduction, the embodiments described below provide a memory device and method for reading and writing data. In one embodiment, a memory device is provided comprising a memory array and first and second data buffers in communication with the memory array. The second data buffer comprises a larger storage capacity than the first data buffer. During a write operation, data is stored in the second data buffer and then stored in the memory array. During a read operation, data is read from the memory array and then stored in the first data buffer but not in the second data buffer. Because the smaller-storage-capacity buffer takes less time to fill than the larger-storage-capacity buffer, there is less of a delay in outputting data from the memory device as compared to memory devices that use a larger-storage-capacity buffer for both read and write operations. Other embodiments are provided, and each of the embodiments can be used alone or in combination with one another.

The embodiments will now be described with reference to the attached drawings.

BRIEF DESCRIPTION OF THE DRAWINGS

FIG. 4 is a block diagram of a circuit of another embodiment in which an ECC logic and buffer component is interposed between first and second data buffers.

FIG. 5 is an illustration showing write operation pipeline timing of the circuit shown in FIG. 4.

DETAILED DESCRIPTION OF THE PRESENTLY PREFERRED EMBODIMENTS

Figure 1:
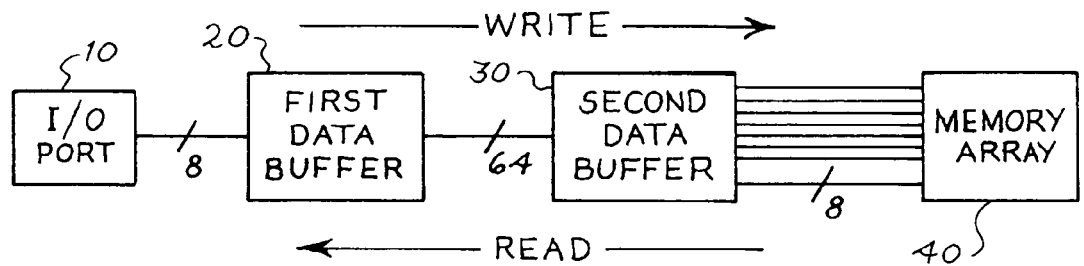
FIG. 1 is a block diagram of a circuit of an embodiment in which first and second data buffers are used in both write and read operations.

Turning now to the drawings, FIG. 1 is a block diagram of a memory circuit comprising an input/output port 10, a first data buffer 20, a second data buffer 30, and a memory array 40. Control circuitry (not shown) controls the transfer of data between the components. Preferably, the first data buffer 20 comprises a smaller storage capacity than the second data buffer 30. In a presently preferred embodiment, the first data buffer 20 is a register that holds 8 bytes of data (an "oct-byte"), which is the minimum writable unit of data, and the second data buffer 30 is a page register that hold 528 bytes (512 bytes of data and 16 bytes of user-defined flags, unused space, etc.). The first and second data buffers 20, 30 can comprise a single register or a plurality of individual registers. Preferably, the first and second data buffers 20, 30 each comprise two sets of registers. In that way, one register can be loaded with data, while the other register is unloading data. While this memory circuit is particularly useful with page-oriented memories, this circuit and the other circuits described herein can be used with non-page-oriented memories.

The input/output port 10 (e.g., a set of pins) is coupled with the first data buffer 20 via an 8-bit bus, the first data buffer 20 is coupled with the second data buffer 30 via a 64-bit bus, and the second data buffer 30 is coupled with the memory array 40 via eight 8-bit buses. It should be noted that different bus structures can be used. For example, in this embodiment, eight 8-bit buses are used to couple the second data buffer 30 with the memory array 40 because the memory array 40 of this embodiment is organized in eight groups of sub-arrays, as will be described in more detail below. In other embodiments, instead of eight 8-bit buses, a 64-bit bus can be used to couple the second data buffer 30 with the memory array 40. As used herein, the term "coupled with" means directly coupled with or indirectly coupled with through one or more named or unnamed components. The term "coupled with" and "in communication with" are used interchangeably herein.

During a write operation, data is supplied from the I/O port 10 to the first data buffer 20 via the 8-bit bus. The transfer of data between the I/O port 10 and the first data buffer 20 can involve a relatively large number of sequential transfers in accordance with specifications that are well known in the art. The first data buffer 20 is associated with a serial-to-parallel converter (not shown) that fills the first data buffer 20 with 8 sets of 8 bits. When the first data buffer 20 is filled with 64 bits, those bits are sent to the second data buffer 30 via the 64-bit bus. This process continues until the second data buffer 30 holds 528 bytes (i.e., a page) of data. The contents of the second data buffer 30 are then transferred to the memory array 40 on the eight 8-bit buses. During a read operation, a page of data is transferred from the memory array 40 to the second data buffer 30 and then to the first data buffer 20, and finally to the I/O port 10. The first data buffer 20 is also associated with a parallel-to-serial converter (not shown) that transfers the 64 bits stored in the first data buffer 20 to the I/O port 10 in sets of 8 bits.

There are several delays associated with a write operation, such as time penalties associated with techniques that are used to achieve a more efficient write operation in terms of power and performance. Examples of such techniques include writing data to fewer sub-arrays in a write operation than a read operation, varying the number of sub-arrays written into in a write operation, and monitoring a memory cell to terminate the programming cycle once the memory cell is determined to be programmed. These techniques are described in the following patent documents, each of which is assigned to the assignee of the present invention and is hereby incorporated by reference: U.S. patent application Ser. No. 10/310,225, U.S. patent application Ser. No. 09/943,655, and U.S. Pat. No. 6,574,145.

The second data buffer 30 allows data to be quickly transferred to a temporary storage structure while awaiting storage in the memory array 40. However, the delays associated with a write operation are not present in a read operation. Further, because the same pipeline is used to both read and write data, an entire page of data is read from the memory array 40 and written into the second data buffer 30 before even a single bit of data from that page is sent to the first data buffer 20 and, ultimately, to the I/O port 10. This delay can be noticeable to an end user, especially if the user spends more time reading from the memory array 40 that writing to the memory array 40, which is likely to happen if the memory array 40 is a write-once memory array.

Figure 2:
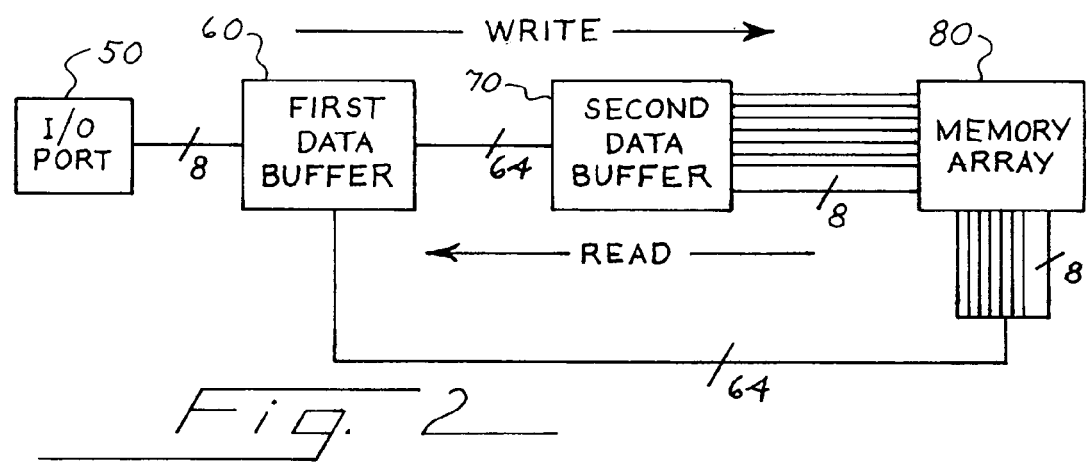
FIG. 2 is a block diagram of a circuit of another embodiment in which a second data buffer is used in a write operation but not a read operation.

To reduce the latency of a read operation (i.e., the time required for data to be read from the memory array and delivered to the I/O port), two different pipelines can be used: a pipeline with the second data buffer for a write operation and a pipeline without the second data buffer for a read operation. FIG. 2 is an example of such an embodiment. As in the circuit shown in FIG. 1, this circuit comprises an I/O port 50, a first data buffer 60, a second data buffer 70, and a memory array 80. The buses coupling these components are similar to those shown in FIG. 1; however, a 64-bit bus has been added between the memory array 80 and the first data buffer 60.

The write pipeline in this circuit is the same as the write pipeline in the circuit shown in FIG. 1. Specifically, data is supplied from the I/O port 50 to the first data buffer 60 and then to the second data buffer 70 until the second data buffer 70 holds a page of data. The contents of the second data buffer 70 are then transferred to the memory array 80. However, during a read operation, a different pipeline is used. Data from the memory array 80 is read directly into the first data buffer 60 instead of first being read into the second data buffer 70. This by-pass of the second data buffer 70 provides a low read latency, which, in one embodiment, is on the order of 100 times lower than the write latency. In this embodiment, instead of waiting for 528 bytes to load into the second data buffer 70, one only waits for 8 bytes to load, after which a constant data rate is achieved. Accordingly, this embodiment reduces or eliminates the need for a separate flow control mechanism to compensate for long read latency.

Figure 3:
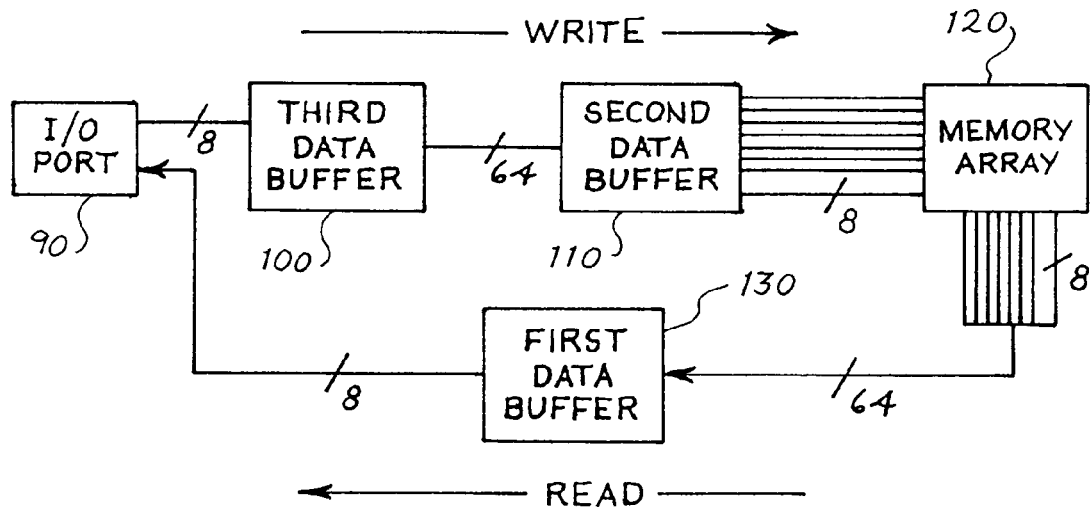
FIG. 3 is a block diagram of a circuit of another embodiment in which a first data buffer is used in a read operation and second and third data buffers are used in a write operation.

There are several alternatives that can be employed with these embodiments. In the circuit of FIG. 2, the first data buffer 60 was part of both the write and read pipelines. In an alternate embodiment, the shared data buffer is replaced by two data buffers—one in the write pipeline and the other in the read pipeline. This alternative is illustrated in the circuit shown in FIG. 3. As shown in FIG. 3, the first data buffer 130 exists in the read—but not the write—pipeline, with buses coupling the first data buffer 130 with the I/O port 90 and the memory array 120. As with the circuit shown in FIG. 2, the write pipeline contains the second data buffer 110. However, the write pipeline in this circuit also contains a third data buffer 100, which, in the embodiment, is the same size as the first data buffer 130.

In another alternative, error correction code (ECC) logic is used to improve memory yield and reliability. This embodiment will be illustrated in conjunction with the circuit shown in FIG. 4. This circuit comprises an I/O port 140, a first data buffer 150, an ECC logic and buffer component 160, a second data buffer 170, and a memory array 180. The write pipeline is similar to the write pipelines in the circuits of FIGS. 1-3 but has an ECC logic and buffer component 160 interposed between the first and second data buffers 150, 170. The ECC logic and buffer component 160 in this embodiment had both encode and decode functionality.

During a write operation, the ECC logic and buffer component 160 encodes the 64 bits of data sent to it by the first data buffer 150 and stores it in its register. Preferably, the ECC logic 160 uses Hamming code to add 8 bits of information for each group of 64 bits of data. The added information can be used to correct a single-bit error in the resulting 72-bit word. The 72-bit word is sent to the second data buffer 170, and, after a page of data is stored in the second data buffer 170, 528 bytes of main data and 64 bytes of ECC syndrome bits are stored in the memory array 180. (Although called a "data" buffer, the second data buffer 170 stores both data and the associated syndrome bits. More generally, the term "data" can refer to either data or data and syndrome bits.) In this embodiment, it is preferred that the memory array have nine groups of sub-arrays and nine buses between the second data buffer 170 and the memory array 180, with the ninth sub-array/bus being used for the ECC syndrome bits.

Turning again to the drawings, FIG. 5 shows a write operation pipeline timing of the circuit shown in FIG. 4. The letters in FIG. 5 (and FIG. 6) refer to a data oct-byte. The first data buffer 150 (the stage 1 storage area) is filled with data from the I/O port 140 via a serial-to-parallel converter, which provides 8 sets of 8 bits to the first data buffer 150. Next, 64 bits are sent from the first data buffer 150 to the ECC logic and buffer component 160 (the stage 2 storage area). The ECC logic encodes with 64 bits with 8 syndrome bits and stores the 72-bit word in the buffer 160. The 72-bit word is then sent from the ECC logic and buffer component 160 to the second data buffer 170 (the stage 3 storage area), and the contents of the second data buffer 170 are sent to the memory array 180 (the stage 4 storage area) via the nine 8-bit buses. As shown in FIG. 5, the second data buffer 170 comprises two ports (the first of which is used to load data while the second is used to unload data), and the data transfer from the second port of the data buffer 170 to the memory array 180 is a separate asynchronous process from the other stages.

Figure 6:
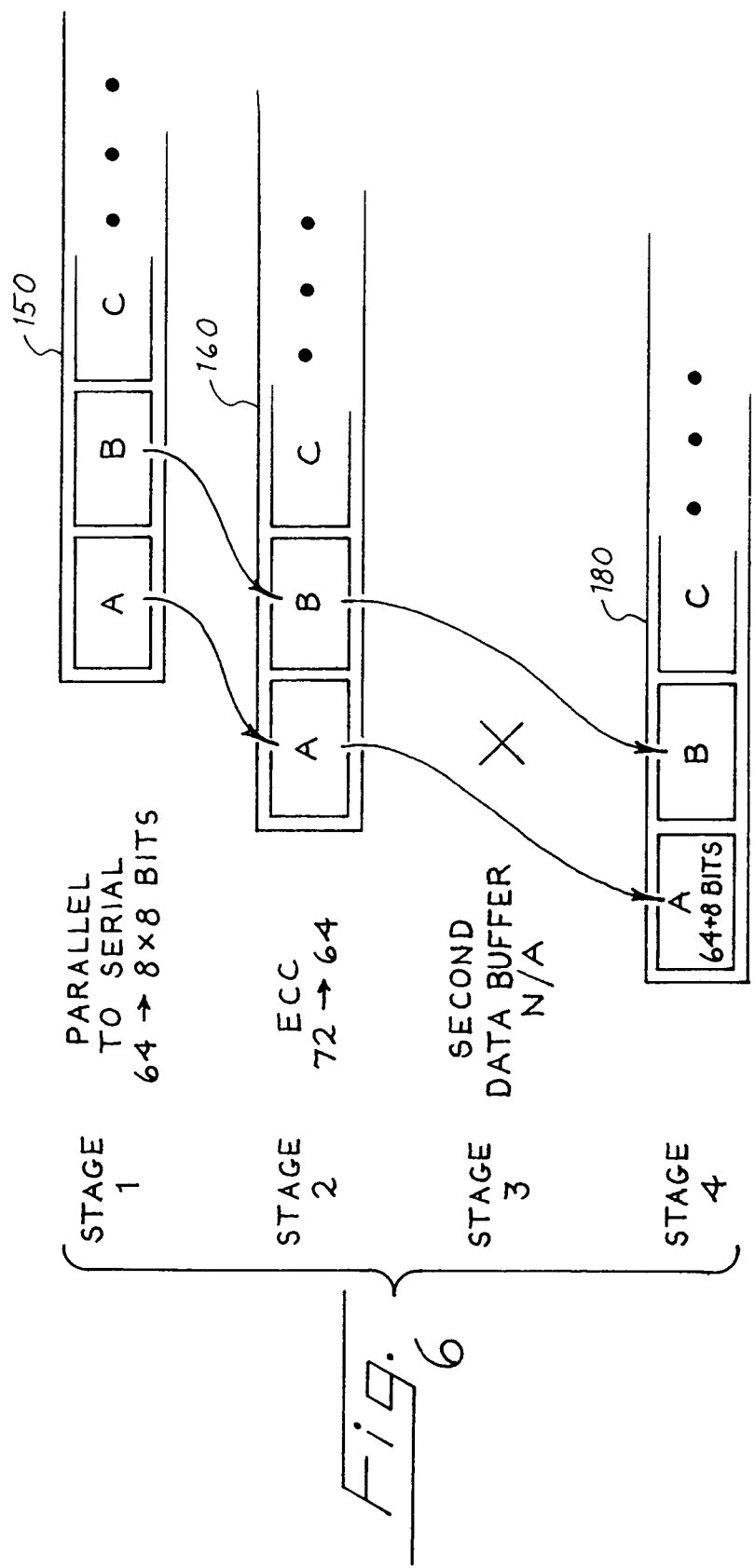
FIG. 6 is an illustration showing read operation pipeline timing of the circuit shown in FIG. 4.

To read data stored in the memory array, a 72-bit word is sent from the memory array 180 to the ECC logic and buffer component 160, bypassing the second data buffer 170. The ECC logic 160 decodes the 72-bit word and generates 64 bits of data, which are sent to the first data buffer 150. As with the circuits described above, the first data buffer 150 in this circuit is associated with a parallel-to-serial converter (not shown) that transfers the 64 bits stored in the first data buffer 150 to the I/O port 140 in sets of 8 bits. As shown in FIG. 6, during a read operation, data is sent from the memory array 180 to the ECC logic and buffer component 160 without first storing the data in the second data buffer 170. In other words, the read pipeline contains one fewer stage that the write pipeline, thereby reducing read latency. The ECC pipeline stage 160 can be removed to further reduce latency to about two-thirds of the original value. This would tradeoff yield for better performance.

In the embodiment shown in FIG. 4, the first data buffer 150 was part of both the write and read pipelines. Similar to the circuit shown in FIG. 3, the first data buffer 150 can be replaced by two data buffers—one being in the read pipeline, and the other being in the write pipeline. In this alternative, the ECC logic and buffer component can be shared between the write and read pipelines or two ECC logic and buffer components can be used—one for the write pipeline and the other for the read pipeline. Additionally, instead of being disposed between the first and second data buffers 150, 170, the ECC logic and buffer component 160 can be disposed between the I/O port 140 and the first data buffer 150, with different input and output bus structures being used where necessary. The ECC logic and buffer component 160 can also be disposed between the second data buffer 170 and the memory array 180. However, in this alternative, it is preferred that either the ECC logic and buffer component be shared between the write and read pipelines or that two ECC logic and buffer components be used—one for the write pipeline and the other for the read pipeline.

Finally, it should be noted than any suitable memory array can be used with these embodiments, and the memory technology used for the memory array can be the same as or different from the memory technology used for the various buffers. In one presently preferred embodiment, the memory array comprises a plurality of field-programmable, non-volatile, write-once, anti-fuse memory cells that are arranged in a plurality of layers stacked vertically above one another in a single integrated circuit to form a three-dimensional memory array, as described in U.S. Pat. No. 6,034,882, which is assigned to the assignee of the present invention and is hereby incorporated by reference. It should be noted that other types of memory arrays can be used. For example, a two-dimensional memory array can be used instead of a three-dimensional memory array, and write-many memory cells can be used instead of write-once memory cells.

In the presently preferred embodiment, the memory array is divided into 80 sub-arrays. A sub-array is a contiguous group of memory cells having contiguous word and bit lines generally unbroken by decoders, drivers, sense amplifiers, and input/output circuits. Memory sub-arrays are preferably used in horizontal groups to store all the information for one page transfer. The group can be physically arranged differently, but this arrangement is convenient. One or a few pages of data are all arranged in one row of memory cells. Spreading the data to multiple sub-arrays is preferable for the operation of error correcting logic, as described in U.S. patent application Ser. No. 10/024,647, which is assigned to the assignee of the present application and is hereby incorporated by reference. Sub-array selection within the group to reduce peak power is described in U.S. patent application Ser. No. 09/748,649, which is also assigned to the assignee of the present application and hereby incorporated by reference. Eight of the sub-arrays in the group contain normal page data. A ninth sub-array contains ECC bits, and the tenth sub-array contains miscellaneous information, such as information about bad row or individual memory cells.

All of the sub-arrays can be powered in a read operation so that any address change is at low latency for read. However, if the memory address space is segmented, the latency is low only within the segment, and a second latency delay can occur when changing segments. In one embodiment, a segment of memory corresponds to those layers of the three-dimensional memory and the set of sub-arrays that are powered-up based on the first memory address of a read request. Other layers and sub-arrays are not power-up to save power. When changing from one memory segment to another, different layers and sub-arrays are power-up, which incurs a second latency delay.

Preferably, the number of sense amplifiers used to read data from the memory array is fewer than the number of bits that can be stored in the second data buffer/page register and are separate from the second data buffer/page register circuit. Since anti-fuse memories are divided into many sub-arrays, each with their own sense amplifiers that do not have to correspond one-to-one to the bits of the second data buffer/page register, fewer sense amplifiers that are more sensitive, have more power, and are closer to the memory bits can be used. Not all of the sense amplifiers have to be powered at the same time. Further, the sense amplifiers and column decoding logic are preferably distributed under the sub-arrays in a checkerboard manner, as described in U.S. Pat. No. 6,567,287, which is assigned to the assignee of the present invention and is hereby incorporated by reference.

While the memory cells in this embodiment are formed from a semiconductor material, other materials, such as phase-change materials and amorphous solids as well as those used with MRAM and organic passive element arrays, can be used. Further, while any type of write-once or write-many memory cells can be used with these embodiments, it is presently preferred that the write-once or write-many memory cells be constructed as described in the following patent applications, each of which is assigned to the assignee of the present invention and is hereby incorporated by reference: write-once—U.S. patent application Ser. Nos. 09/192,883; 09/814,727; 09/928,536; 10/185,508; and 10/326,470; write-many—U.S. patent application Ser. Nos. 09/927,648; 10/180,046; 10/325,951; 10/335,078; and 10/335,089.

In one embodiment, the memory circuits shown above are part of a modular memory device (such as a memory card or stick) that is removably connectable to a host device (e.g., a digital camera, a digital audio player, a person digital assistant, etc.) via mating connections that reads data from/writes data to the memory array.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A memory device comprising:
   a memory array;
   a first data buffer in communication with the memory array;
   a second data buffer in communication with the memory array and in series with the first data buffer, the second data buffer comprising a larger storage capacity than the first data buffer, wherein the first data buffer is not between the second data buffer and the memory array; and
   an input-output port in series with the first and second data buffers, wherein the first and second data buffers are between the input-output port and the memory array;
   wherein the second data buffer is used during a write operation to store data before the data is stored in the memory array, and wherein the first data buffer, but not the second data buffer, is used during a read operation to store data read from the memory array and wherein the memory device does not contain an additional data buffer between the first and second data buffers and the memory array.

2. The invention of claim 1, wherein the first data buffer is also used during the write operation to store the data before it is stored in the second data buffer.

3. The invention of claim 1, wherein the first data buffer is not used during the write operation.

4. The invention of claim 1 further comprising:
ECC logic between the input-output port and the first data buffer.

5. The invention of claim 1 further comprising ECC logic between the first data buffer and the second data buffer.

6. The invention of claim 1 further comprising ECC logic between the second data buffer and the memory array.

7. The invention of claim 1 further comprising a plurality of sense amplifiers, wherein the number of sense amplifiers is fewer than the number of bits that can be stored in the second data buffer.

8. The invention of claim 1, wherein the memory array comprises a plurality of memory cells arranged in a plurality of layers stacked vertically above one another in a monolithic integrated circuit.

9. The invention of claim 1, wherein the memory array comprises a two-dimensional memory array.

10. The invention of claim 1, wherein the memory array comprises a plurality of write-once memory cells.

11. The invention of claim 1, wherein the memory array comprises a plurality of write-many memory cells.

12. The invention of claim 1, wherein the memory array comprises a plurality of anti-fuse memory cells.

13. The invention of claim 1 further comprising an integrated circuit comprising the memory array and first and second data buffers, wherein the integrated circuit is adapted to be releasably coupled to a host device.

14. The invention of claim 1, wherein the second data buffer comprises a page register.

15. A method for writing and reading data in a memory device comprising a memory array, a first data buffer, a second data buffer, in series with the first data buffer and an input-output port—in series with the first and second data buffers, wherein the first and second data buffers are between the input-output port and the memory array, wherein the second data buffer comprises a larger storage capacity than the first data buffer, wherein the first data buffer is not between the second data buffer and the memory array, and wherein the memory device does not contain an additional data buffer between the first and second data buffers and the memory array, the method comprising:
during a write operation, storing data in the second data buffer and then storing the data in the memory array; and
during a read operation, reading the data from the memory array and then storing the data in the first data buffer but not the second data buffer.

16. The invention of claim 15 further comprising:
during the write operation, storing the data in the first data buffer before storing the data in the second data buffer.

17. The invention of claim 15, wherein the first data buffer is not used during the write operation.

18. The invention of claim 15 further comprising:
during the read operation, decoding the data with ECC logic.

19. The invention of claim 18, wherein the ECC logic is between the input-output port and the first data buffer.

20. The invention of claim 18, wherein the ECC logic is between the first data buffer and the second data buffer.

21. The invention of claim 18, wherein the ECC logic is between the second data buffer and the memory array.

22. The invention of claim 15 further comprising a plurality of sense amplifiers, wherein the number of sense amplifiers is fewer than the number of bits that can be stored in the second data buffer.

23. The invention of claim 15, wherein the memory array comprises a plurality of memory cells arranged in a plurality of layers stacked vertically above one another in a monolithic integrated circuit.

24. The invention of claim 15, wherein the memory array comprises a two-dimensional memory array.

25. The invention of claim 15, wherein the memory array comprises a plurality of write-once memory cells.

26. The invention of claim 15, wherein the memory array comprises a plurality of write-many memory cells.

27. The invention of claim 15, wherein the memory array comprises a plurality of anti-fuse memory cells.

28. The invention of claim 15 further comprising an integrated circuit comprising the memory array and first and second data buffers, wherein the integrated circuit is adapted to be releasably coupled to a host device.

29. The invention of claim 15, wherein the second data buffer comprises a page register.

30. The invention of claim 1 further comprising a third data buffer that stores the data before it is stored in the second data buffer.

31. The invention of claim 15 further comprising:
during the write operation, storing the data in a third data buffer before storing the data in the second data buffer.

32. The invention of claim 1, wherein a read path between the first data buffer and the memory array and a write path between the second data buffer and the memory array do not share a common bus.

33. The invention of claim 15, wherein a read path between the first data buffer and the memory array and a write path between the second data buffer and the memory array do not share a common bus.

* * * * *

UNITED STATES PATENT AND TRADEMARK OFFICE
CERTIFICATE OF CORRECTION

PATENT NO.         : 7,243,203 B2                              Page 1 of 1
APPLICATION NO. : 10/461295
DATED              : July 10, 2007
INVENTOR(S)       : Roy E. Scheuerlein It is certified that error appears in the above-identified patent and that said Letters Patent is hereby corrected as shown below:

In the Claims

Column 7, in claim 15, line 3, immediately after "second data buffer" delete "," (comma); and immediately after "first data buffer" insert --,-- (comma).

Column 7, in claim 15, line 4, after "input-output" delete "port—in" and substitute --port in-- in its place.

Signed and Sealed this

Twentieth Day of November, 2007

JON W. DUDAS
*Director of the United States Patent and Trademark Office*